United States Patent [19]

Hino

[11] 4,292,582
[45] Sep. 29, 1981

[54] RESIDUAL VOLTAGE REGULATING CIRCUIT FOR HALL ELEMENT

[75] Inventor: Mitsuaki Hino, Tokyo, Japan

[73] Assignee: Nippon Klingage Kabushiki Kaisha, Tokyo, Japan

[21] Appl. No.: 914,983

[22] Filed: Jun. 12, 1978

[30] Foreign Application Priority Data

Jun. 22, 1977 [JP] Japan .................................. 52/74000
Nov. 22, 1977 [JP] Japan .................................. 52/140413
Dec. 12, 1977 [JP] Japan ........................... 52/166790[U]
Dec. 12, 1977 [JP] Japan ........................... 52/166791[U]

[51] Int. Cl.³ .............................................. G05F 7/00
[52] U.S. Cl. ................................... 323/294; 307/309; 324/117 H
[58] Field of Search ..................... 307/309; 323/94 H; 324/117 H, 251; 338/32 H

[56] References Cited

U.S. PATENT DOCUMENTS

| | | |
|---|---|---|
| 3,021,459 | 2/1962 | Grubbs, Jr. et al. |
| 3,555,310 | 1/1971 | Haevsler .................. 338/32 H X |
| 3,886,446 | 5/1975 | Laranov et al. .......... 323/94 H X |
| 4,037,150 | 7/1977 | Taranov et al. .......... 323/94 H X |

Primary Examiner—William M. Shoop
Attorney, Agent, or Firm—Cushman, Darby & Cushman

[57] ABSTRACT

The present invention relates to a residual voltage regulating circuit for a Hall element improving the dependency on temperature of the output voltage of the Hall element and the secular changes of the Hall element.

9 Claims, 24 Drawing Figures

RESIDUAL VOLTAGE REGULATING CIRCUIT FOR HALL ELEMENT

BACKGROUND OF THE INVENTION

1. Field of the Invention

The present invention relates to a residual voltage regulating circuit for a Hall element, and more particularly to a residual voltage circuit for a Hall element improving dependency on temperature of the output voltage of the Hall element and secular changes of the element.

2. Description of the Prior Art

The large dependency on temperature of the Hall output voltage of Hall elements has conventionally hampered; the application of Hall elements to various field. The dependency on temperature of the Hall element was fundamentally controlled, to some extent, according to the material of the Hall element. Even Hall elements composed of germanium, indium and arsenic materials, which are said to have relatively good temperature characteristics, have temperature coefficients in the range of 0.03%/° C. -0.1%/° C., and therefore, were unsuitable for performing highly accurate measurements at working temperatures ranging from −20° C. to +90° C.

More specifically, the residual voltage generated during periods of zero magnetic field varied depending upon the change in temperature, and the voltage variations at the output terminals had an additive effect when measuring the magnetic field, thus producing in the inaccurate measurement.

In order to eliminate the above-mentioned problem, fixed resistance R, thermistor TH, and variable resistor (s) VR have been connected between the control current input terminals 2a and 2b of Hall element, and between the Hall voltage output terminals 3a and 3b, as shown in FIG. 1 (a) and FIG. 1 (b) in order to improve temperature dependence and reduce the residual output voltage when no magnetic field is applied to the element. In these external compensating circuits, in general, the positions of each variable resistor differed depending on that type of Hall element. In addition the values of fixed resistance R and thermistor TH had to be varied with the different types of Hall element materials. The above made re-biasing necessary whenever a Hall element having a different residual voltage during periods of zero magnetic field was substituted.

SUMMARY OF THE INVENTION

The main object of the present invention is to set the steady state voltage of any Hall element at zero during periods of zero magnetic field by removing the non-uniformity of the various Hall elements themselves and the unevenness in characteristics due to the difference in Hall element material and external conditions.

Accordingly, for accomplishing the purpose, the inventor offers a residual voltage regulating circuit capable of making the residual voltage zero by means of separating the voltage producing effects wherefrom the produced voltage polarity changes with reversal of the applied magnetic field polarity, or the non-even effect of the magnetic field, and the voltage producing effects wherefrom the polarity of the produced voltage does not change with reversal of the applied magnetic field polarity, or the even effect of the magnetic field.

BRIEF DESCRIPTION OF THE ACCOMPANYING DRAWINGS

FIG. 1 (a) and FIG. 1 (b) are circuit block diagrams of the conventional residual voltage regulating circuits for Hall elements;

FIG. 2 is an equivalent circuit diagram for a Hall element;

FIG. 3 (a) FIG. 4 and FIG. 5 are block diagrams explaining the functions of 3-terminal Hall elements of the first embodiments; FIG. 3 (b) is a block diagram showing the embodiment with a 4-terminal Hall element;

FIG. 6 is a block diagram of the residual voltage regulating circuit which is the preferred embodiment of the present invention;

FIG. 7 (a), FIG. 7 (b), FIG. 8, FIG. 9 (a) and FIG. 9 (b) are block diagrams explaining the functions of the 4-terminal Hall element of the second embodiment;

Figure 12A:
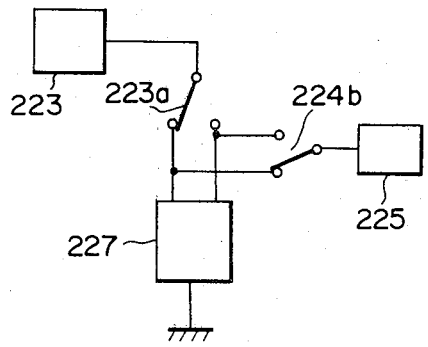
Figure 12B:
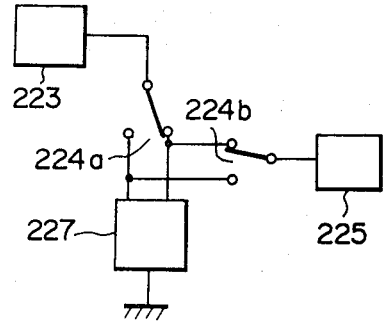
Figure 13:
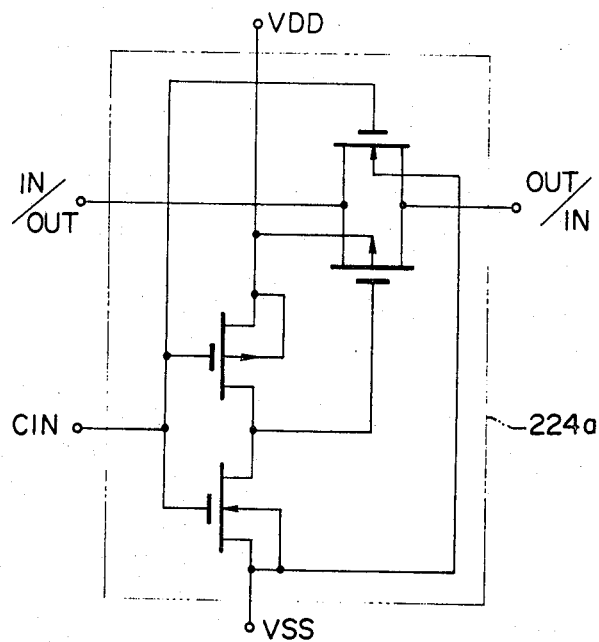
Figure 14A:
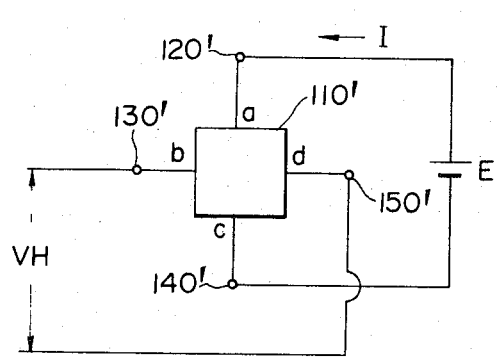
Figure 14B:
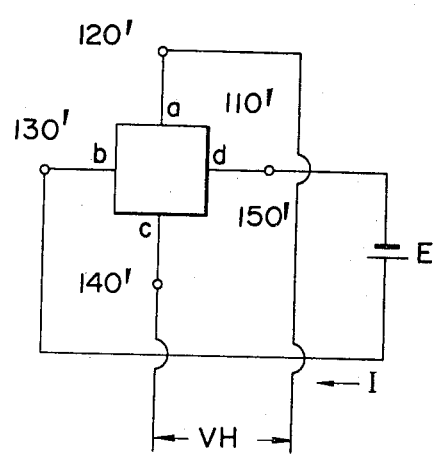
Figure 15:
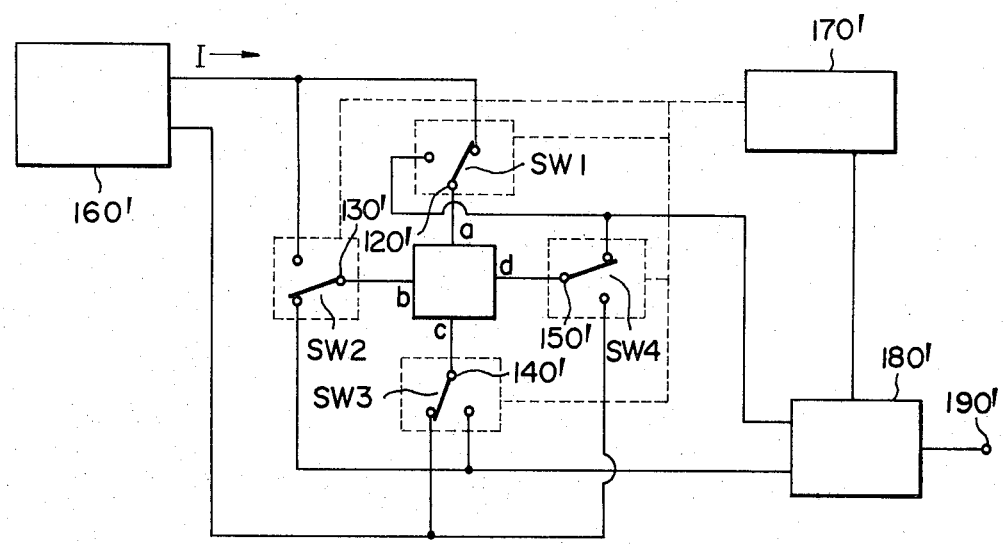
Figure 16:
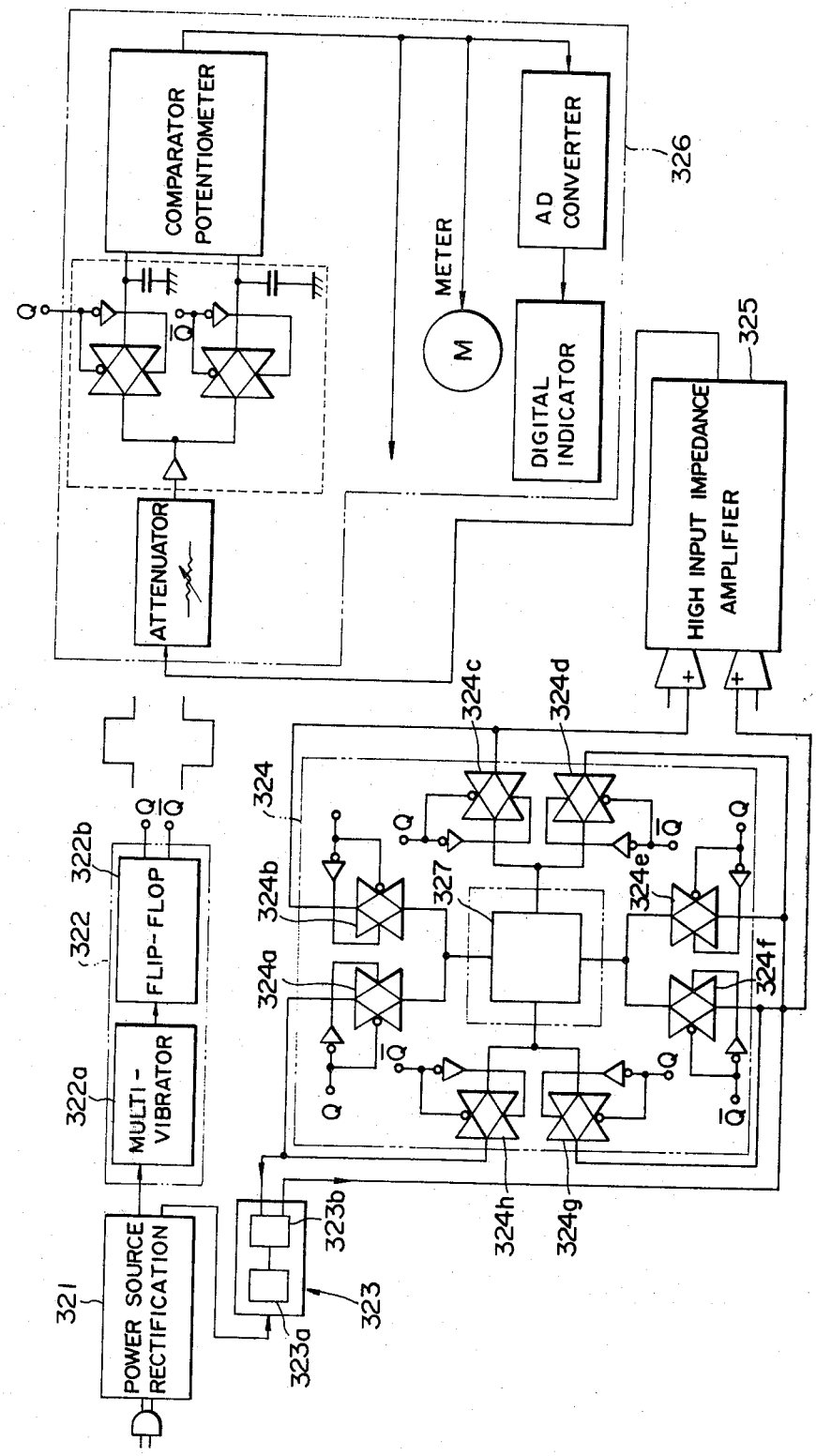

FIG. 12 (a) and FIG. 12 (b) are block diagrams showing the functions of the switch circuits;

FIG. 13 is a block diagram explaining the functions of the analog switch circuit;

FIG. 14 (a) and FIG. 14 (b) are block diagrams explaining the functions of the 3-terminal Hall element of the fourth embodiment;

FIG. 15 is a block diagram of the residual voltage regulating circuit;

FIG. 16 is a block diagram of the residual voltage circuit which is the preferred embodiment; and FIG. 17 (a) and FIG. 17 (b) are block diagrams showing the function of the switch circuits.

Before entering into the explanation on the present invention, explanation is made of the principle control to understanding the present invention.

Figure 1A:
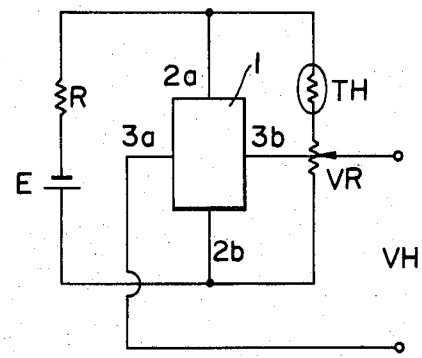
Figure 1B:
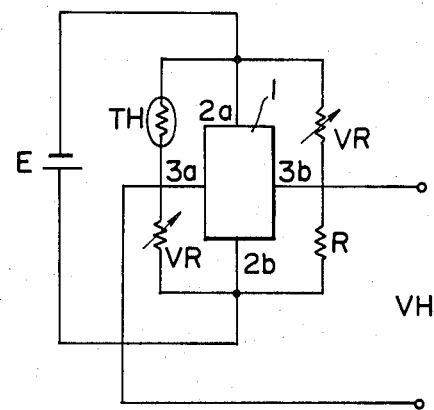
Figure 2:
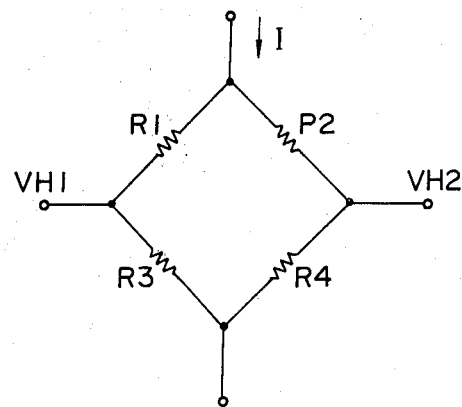

In general, in the equivalent circuit of a Hall element, as shown in FIG. 2, the voltages generating between the Hall voltage output terminals 3a and 3b (See FIGS. 1(a) and 1(b) of a hall element are broadly divided into the voltage due to the variations in balance of internal resistances R1–R4 of the Hall element which are dependent on changes in temperature and magnetic field, and Hall voltage due to the Hall effect (with the voltage due to Nernst effect being disregarded). In order to produce only the Hall voltage from the Hall voltage output terminals, it is required to cancel the voltage imbalance generated from variations in the internal resistances R1–R4.

The present invention, therefore, utilizes the fact that the Hall Voltage and the voltage due to the variation in the internal resistances R1–R4 are the phenomenon of the magnetic field to which voltage is applied externally, and the voltages generated by these phenomena are separated based on the principle that the separation may be effected by utilizing the relation of changes in voltage polarity to changes in magnetic field polarity. That is to say, the polarity of the Hall effect voltage changes with reversals in the polarity of the magnetic field, which phenomena is referred to as the non-even effect of the magnetic field, while the polarity of the voltage resulting from internal resistance imbalance does not change with reversals in the polarity of the magnetic field, which phenomena is referred to as the even effect of the magnetic field.

In the main embodiment is the residual voltage regulating circuit for Hall elements the control current supplying power source is alternately connected between two terminals of the 3-terminal or the 4-terminal Hall element. The Hall voltage is obtained and the voltages including the Hall voltage between said two terminals by means of utilizing the even effect and non-even effect of the magnetic field, whereby making it possible to detect the potential difference of the voltages.

Figure 4:
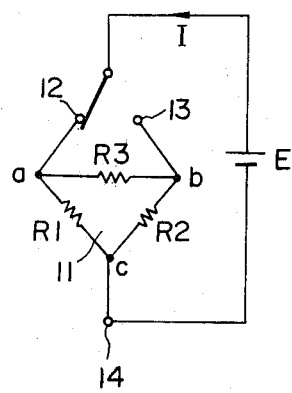

In the embodiment shown in FIG. 5(a) using a 3-terminal Hall element 11, the positive pole of the control current supplying power supply can be impressed selectively on the terminals 12 and 13 by means of the switch SW, and the negative pole of the power supply is connected to terminal 14, thus forming the residual voltage regulating circuit. In this circuit, when the above-mentioned switch connects terminal 12, the voltages between terminals 12 and 14 are expressed by the following equations as a result of the equivalent circuit shown in FIG. 4:

The voltage between a and c is:

$$VHA_{ac} = \frac{1}{\frac{1}{R1} + \frac{R2}{R2+R3}} \times I = \frac{R1(R2+R3)}{R1+R2+R3} \times I$$

while, the voltage between b and c is:

$$VHA_{bc} = \frac{R1(R2+R3)}{R1+R2+R3} \times \frac{1}{R2+R3} \times I = \frac{R1+R2}{R1+R2+R3} \times I$$

Similarly, when the power E is impressed between terminals 13 and 14 by changing over the switch SW, the voltage between b and c is:

$$VHB_{bc} = \frac{1}{\frac{1}{R2} + \frac{1}{R1+R3}} \times I = \frac{R2(R1+R3)}{R1+R2+R3} \times I$$

while, the voltage between a and c is:

$$VHB_{ac} = \frac{R2(R1+R3)}{R1+R2+R3} \times \frac{R1}{R1+R3} \times I = \frac{R1+R2}{R1+R2+R3} \times I$$

From the above equations, $VHA_{bc}$ is equal to $VHB_{ac}$.

Figure 5:
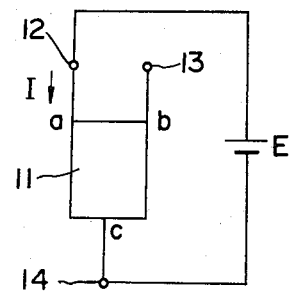

Concerning the aspect of the generation of Hall voltage, in FIG. 5, when the control current flows between the terminals 12 and 14, the Hall voltage $VH_{bc}$ generated between the terminals 13 and 14 is expressed by:

$$VH_{bc} \alpha (R_H \cdot IB/t)$$

where,
$R_H$ = Hall coefficient
$B$ = Magnetic flux density
$t$ = Thickness of Hall element
And, when the control current flows between the terminals 13 and 14, the Hall voltage generating between the terminals 12 and 14 is expressed by:

$$VH_{ac} \alpha (R_H \cdot IB/t)$$

obtaining the voltage inverse in polarity to the above-mentioned $VH_{bc}$, and this corresponds to said non-event effect.

From the above, when the switch SW is turned on the side of terminal 12, the voltages including Hall voltage between the terminals 13 and 14, $V_{bc}$, is expressed by:

$$V_{bc} = \frac{R1 \times R2}{R1+R2+R3} \times I + VH_{bc}$$

and, similarly the voltages between the terminals 12 and 14, $V_{ac}$ is expressed by:

$$V_{ac} = \frac{R1 \times R2}{R1+R2+R3} \times I + VH_{ac}$$

so that the difference of the both voltages is expressed by:

$$V_{bc} - V_{ac} = |VH_{bc}| + VH_{ac}|$$

The above means that the variations in the internal resistances R1, R2 and R3 (even effect) due to the changes in temperatures and magnetic field are eliminated.

However, in order for the above equations to be valid, the internal resistances R1, R2 and R3 must not vary while $V_{bc}$ and $V_{ac}$ are measured, that is, both voltages must be measured in a short time. Also, when a 4-terminal Hall element 11' is used as shown in FIG. 3(b), similar results are obtainable.

Figure 6:
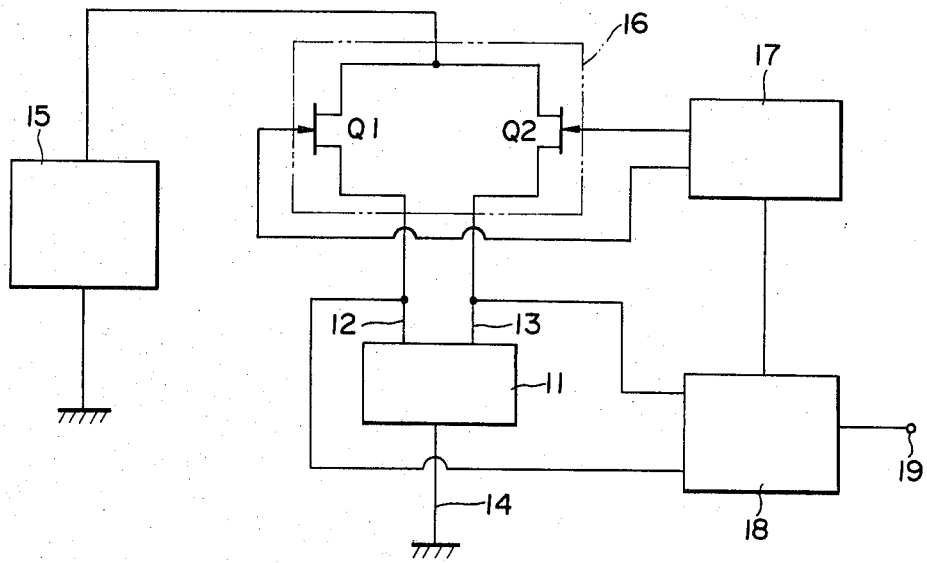

FIG. 6 shows the preferred embodiment for measuring the above-mentioned voltage during a short time period, wherein 15 is the DC power source for supplying the control current, 16 is the gate for connecting the above-mentioned DC power source alternately between the terminals 12 and 14 and between the terminals 13 and 14 of the Hall element 11, 17 is the oscillator for driving the above-mentioned gate, 18 is the potentiometer for measuring the voltages between the terminals 12 and 14 and the terminals 13 and 14 of the Hall element 11 in synchronization with the oscillation periodicity of the oscillator 17, 19 is the output terminal of potentiometer, and Q1 and Q2 are the field effect transistors forming the gate.

In this construction, if the two output pulses of oscillator 17 having a frequency of 1/T (500 Hz) and a phase difference of ½T are impressed on the gates of field effect transistors Q1 and Q2, said transistors conduct alternately at the above-mentioned frequency, whereby the control current I flows from the DC power source 15 between the terminals 12 and 14 and between the terminals 13 and 14 of the Hall element 11. The voltage appearing at the non-conductive Hall element terminal at the above-mentioned frequency (delayed by ½T) is determined in the potentiometer and is measured through the output terminal 19. The above-mentioned residual voltage regulating circuit makes possible zero point compensation accuracy up to 0.5 gauss and zero point temperature variations accuracy up to 0.05 gauss/° C. with the Hall elements different in lot.

As mentioned above, the present invention makes it possible to determine only the Hall voltage as the output, so as to result in a practical zero point accuracy up to 0.5 gauss/° C. and zero point temperature variations accuracy up to 0.05 gauss/° C., because the control current supplying power source is connected alternately between two terminals of a 3-terminal or 4-terminal Hall element, whereby arrangements are made to obtain the Hall voltage by means of utilizing the even effect and non-even effect of magnetic field and to detect the potential difference between the voltages at the above mentioned two terminals.

The second embodiment is a residual voltage regulating circuit wherein the control current supplying power source is alternately connected between two different terminals of a 4-terminal Hall element through a switching circuit and the Hall voltage and the voltages including the Hall voltage are obtained between said two terminals by means of utilizing the even effect and non-even effect of the magnetic field, whereby making it possible to detect the potential difference of the voltages representing the Hall voltage.

Figure 7A:
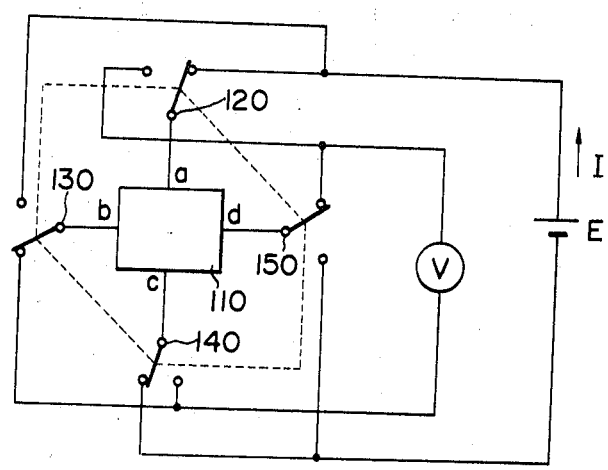
Figure 7B:
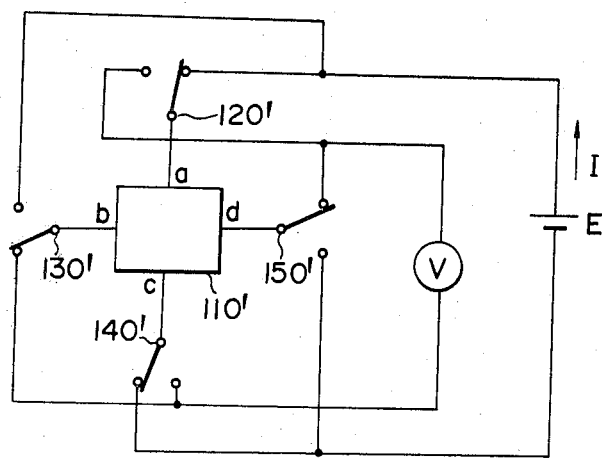

In order to separate the voltages, as shown in FIGS. 7a and 7b for example, the change-over switches SW1-SW4 are connected among each terminal 120-150 of the 4-terminal Hall element 110, the control current supplying power source E and the terminals 160a-190b of the voltmeter V, and arrangements are made so as to connect the voltmeter selectively between the terminals 150 and 120 and between the terminals 130 and 140, with a positive voltage applied to terminals 120 and 130 of the 4-terminal Hall element and with a negative applied to terminals 140 and 150 of the 4-terminal Hall element. In this circuit, as shown in FIGS. 7a and 7b, when the control current supplying power source E is connected between the terminals 120 and 140 and the voltmeter V is connected between the terminals 130 and 150 by means of the above-mentioned switches, the voltage between terminals 130 and 140 is expressed by the following equation due to the equivalent circuit of 4-terminal Hall element 110 shown in FIG. 8:

$$VHA_{bc} = \frac{(R3 + R4)(R1 + R2)}{R1 + R2 + R3 + R4} \times \frac{R2}{R1 + R2} \times I \quad (1)$$
$$= \frac{R2(R3 + R4)}{R1 + R2 + R3 + R4} \times I$$

while, the voltage between terminals 140 and 150 is expressed by the following equation:

$$VHA_{cd} = \frac{(R1 + R2)(R3 + R4)}{R1 + R2 + R3 + R4} \times \frac{R4}{R3 + R4} \times I \quad (2)$$
$$= \frac{R3(R1 + R2)}{R1 + R2 + R3 + R4} \times I$$

Accordingly, from the equations (1) and (2) it follows that the voltage between terminals 130 and 150 are expressed by $$\frac{R4R2 - R3R1}{R1 + R2 + R3 + R4} \times I.$$

Next, with source E applied across terminals 130 and 150 the voltage between terminal 120 and 150 is expressed by:

$$VHB_{ad} = \frac{(R1 + R4)(R2 + R3)}{R1 + R2 + R3 + R4} \times \frac{R4}{R1 + R4} \times I \quad (3)$$
$$= \frac{R4(R2 + R3)}{R1 + R2 + R3 + R4} \times I$$

while, the voltage between 140 and 150 are expressed by:

$$VHB_{cd} = \frac{(R2 + R3)(R1 + R4)}{R1 + R2 + R3 + R4} \times \frac{R3}{R2 + R3} \times I \quad (4)$$
$$= \frac{R3(R1 + R4)}{R1 + R2 + R3 + R4} \times I$$

Accordingly, from the equations (3) and (4) it follows that the voltage between terminals 120 and 140 is expressed by:

$$\frac{R4R2 - R3R1}{R1 + R2 + R3 + R4} \times I,$$

the same as the voltage between terminals 130 and 150 prior to switching.

If an inspection is made of the polarities of the voltage between b and d and the voltage between a and c which are obtained by changing over the switches SW1-SW4, when the Hall voltage between b and d comes to +VH, the Hall voltage between a and c comes to −VH with the same direction of magnetic field. Therefore, the difference of voltages including the Hall voltages between b and d and between a and c comes to 2VH.

Figure 9A:
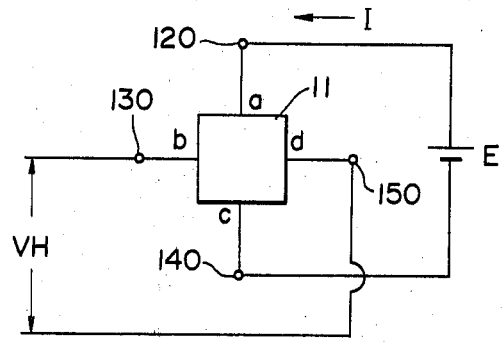
Figure 9B:
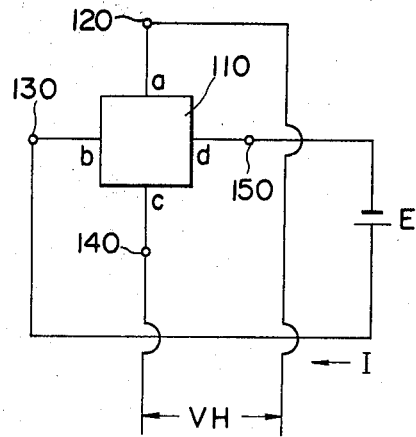

Namely, as shown in FIG. 9 (a) and FIG. 9 (b), if the control current supplying power source E is connected between the terminals 120 and 140 of 4-terminal Hall element 110, and if the Hall voltage between terminals 130 and 150 is $VH_{bd} = +VH$, when the current I flows between a and c of the above-mentioned Hall element by the magnetic field B, the Hall voltage between terminals 120 and 140 comes to $VH_{ac} = -VH$ when the control current supplying power source E is connected between terminals 130 and 150 and the current I flows between b and c of Hall element by the same magnetic field B.

Figure 10:
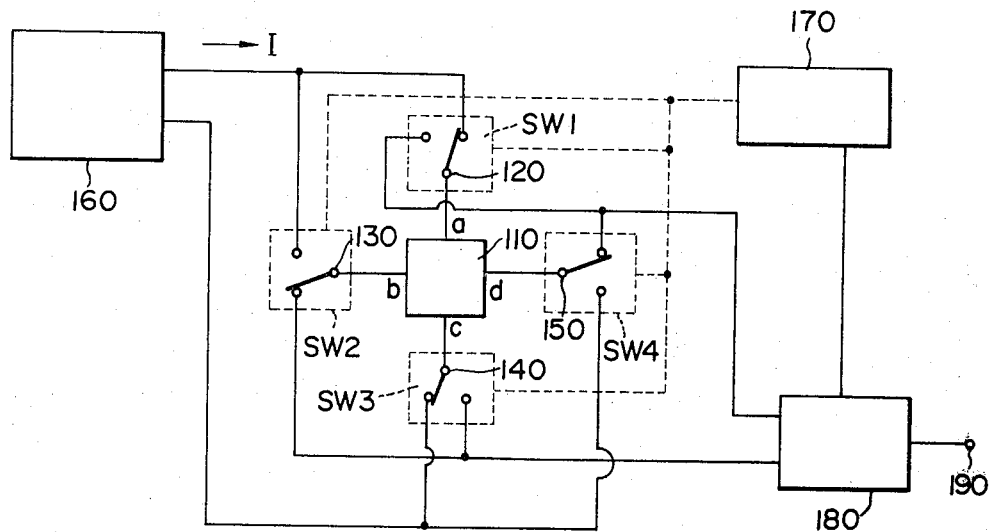
FIG. 10 is a block diagram of the residual voltage regulating circuit which is the preferred embodiment of the present invention.

FIG. 10 shows the preferred embodiment for measuring the above-mentioned voltages in a short time, wherein 160 is a DC power source for supplying the control current, 170 is an oscillator for controlling switches (analog switches) SW1-SW4 work, and 180 is a potentiometer for measuring the output voltage of Hall element 110 in the form of AC or DC on the output terminal 190 for the purpose of determining the Hall voltage of Hall element 110.

Namely, the current I flows, as controlled by the output of oscillator 170, from the DC power source 160 across the terminals 120 and 140 of Hall element 110. The voltage generated between terminals 130 and 150 as a result of the magnetic field B is measured with the potentiometer 180. When the DC current I flows across the terminals 130 and 150, as controlled by the next half-cycle of the output of oscillator 170, the voltage generated between terminals 120 and 140 as a result of the magnetic field B is measured with the potentiometer 180, and the results appear at output terminal 190 and are applied to other meters and recorders not shown in FIG. 10. By using such a circuit, the zero point compensation accuracy up to 0.2 gauss and the zero point temperature variations accuracy up to 0.02 gauss/°C. can be obtained with a Hall element.

As mentioned before, the present invention enables the measurement of only the Hall voltage making it possible to regulate the zero point accuracy up to 0.5 gauss and the temperature variations at zero point up to 0.5 gauss/°C., because the control current supplying power source is connected alternately between two different pairs of two terminals two terminals of a 4-terminal Hall element to obtain the output voltages, including the Hall voltage, between the above-mentioned two pairs of terminals, whereby arrangement is made so as to detect the potential difference of the output voltages so as to isolate the Hall voltage utilizing the even effect and non-even effect of the magnetic field.

The third embodiment is a residual voltage regulating circuit for a Hall element wherein analog switches are utilized for connecting constant-current regulated power and a high input impedance amplifier alternately between the two terminals of 3-terminal Hall element. The analog switches are controlled by an oscillator output.

Figure 3A:
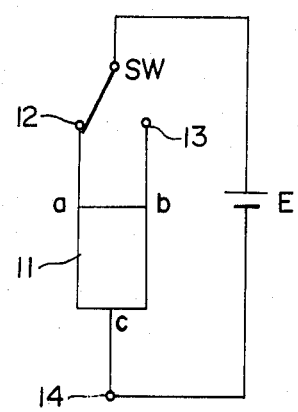
Figure 3B:
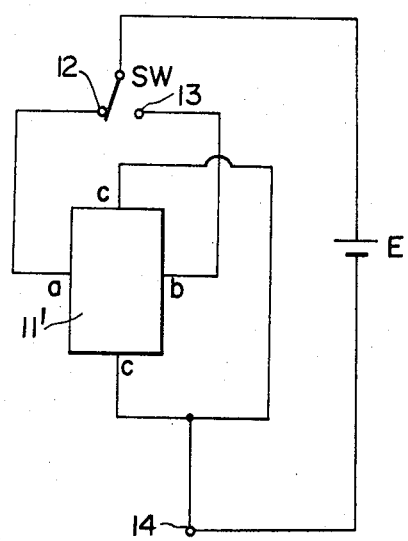

In this embodiment, in order to accomplish the separation of voltages, for example, 3-terminal Hall element 11 is used as shown in FIG. 3 (a), whereby a residual voltage regulating circuit connects the positive pole of the control current supplying power source E selectively to terminals 12 and 13 by means of the switch SW and connects the negative pole of the above-mentioned power source to the terminal 14. The voltage between the terminals 12 and 14, when the above-mentioned switch connects terminal 12 the voltage source E, as determined by the equivalent circuit shown in FIG. 4, the voltage between a and c is expressed by the equation;

$$VH_{Aac} = \frac{1}{\frac{1}{R1} + \frac{1}{R2 + R3}} \times I = \frac{R1(R2 + R3)}{R1 + R2 + R3} \times I$$

and the voltage between b and c is expressed by the equation;

$$VH_{Abc} = \frac{R1(R2 + R3)}{R1 + R2 + R3} \times \frac{R2}{R2 + R3} \times$$
$$I = \frac{R1 \times R2}{R1 + R2 + R3} \times I$$

Similarly, in case the power E is impressed between the terminals 13 and 14 by means of changing over the switch SW, the voltage between b and c is expressed by the equation;

$$VH_{Bac} = \frac{1}{\frac{1}{R2} + \frac{1}{R1 + R3}} \times I = \frac{R2(R1 + R3)}{R1 + R2 + R3} \times I$$

while, the voltage between a and c is expressed by the equation;

$$VH_{Bac} = \frac{R2(R1 + R3)}{R1 + R2 + R3} \times \frac{R1}{R1 + R3} \times$$
$$I = \frac{R1 \times R2}{R1 + R2 + R3} \times I$$

From the above equations, $VH_{Abc}$ is equal to $VH_{Bac}$.

And further, when control current I flows between terminals 12 and 14 in FIG. 5, the Hall voltage $VH_{bc}$ generated between the terminals 13 and 14 is expressed by:

$$VH_{bc} \alpha (R_H \cdot IB/t)$$

where,
$R_H$ = Hall coefficiency
B = Magnetic flux density
t = Thickness of Hall element And also, when control current I flows between terminals 13 and 14, the Hall voltage $VH_{ac}$ generated between terminals 12 and 14 is expressed by:

$$VH_{ac} \alpha (R_H \cdot IB/t)$$

and, therefore, the voltage is inverse in polarity to the above-mentioned $VH_{bc}$, corresponding to the above-mentioned non-even effect.

From the above, when the switch SW is turned on the side of terminal 12, the voltage $V_{bc}$, including the Hall voltage, between the terminals 13 and 14 is expressed by;

$$V_{bc} = \frac{R1 \times R2}{R1 + R2 + R3} \times I + VH_{bc}$$

Similarly, the voltage $V_{ac}$ between the terminals 12 and 14 is expressed by;

$$V_{ac} = \frac{R1 \times R2}{R1 + R2 + R3} \times I + VH_{ac}$$

Therefore, the difference between these voltages is expressed by:

$$V_{bc} - V_{ac} = |VH_{bc}| + |VH_{ac}|$$

The above means that the variations in the internal resistances R1, R2 and R3 (even effect) due to the temperature magnetic field, etc. are eliminated. However, no variation in the above-mentioned internal resistances R1, must exist during the time of measuring both $V_{bc}$ and $V_{ac}$ even when a 4-terminal Hall element 11' is used, as shown in FIG. 3 (b), the same conduction must be maintained.

Figure 11:
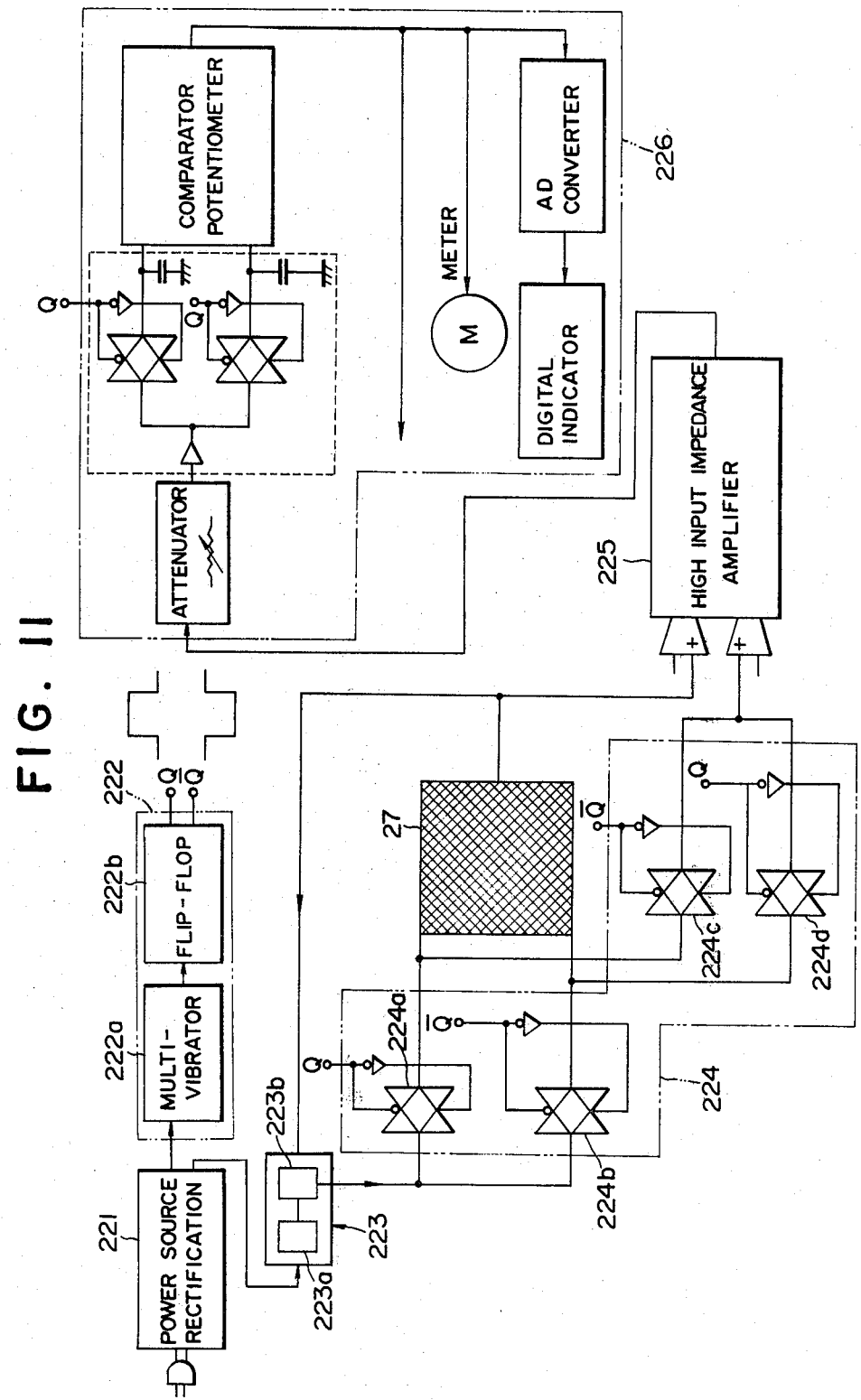
FIG. 11 is a block diagram showing the third embodiment.

FIG. 11 illustrates a more detailed residual voltage regulating circuit in accordance with the present invention consisting of power source section 221, oscillator section 222 composed of free running multivibrator 222a and flip-flop circuit 222b, constant-current regulated power section 223 for the Hall element control current composed of reference voltage generator 223a and volt-ampere transducer 223b, switch section 224 composed of four analog switches 224a–224d enabling the removal of the even effect of magnetic field representing the resistance variation by the two functions shown in FIG. 12 (a) and FIG. 12 (b), and amplifying section 225, while 226 indicates the output circuit.

If no magnetic field is applied to the Hall element 27 (sample) to be regulated which is connected between the constant-current power section 223 and the amplifying section 225 through the analog switches 224a–224d, etc., Hall element 27 is regarded as the pure resistance and, with the functions of the switch section 224, the output voltage from the switch section comes to zero. In this case, the current produced by constant-current regulated power section 323 must be the same whether analog switches 224a–224d are arranged to perform function (a) or function (b) (See FIGS. 17(a) and 17(b), respectively).

Also, analog switches 224a–224d may be constructed as shown in FIG. 13 in order to avoid errors caused by switching spikes. When MOS analog switches as shown in FIG. 13 were used as the analog switches, zero-movement of less than 3 gauss was measured between the excitation frequencies of 4 kHz and 200 Hz. However, such zero movement can be eliminated by other zero adjusting circuits.

Next, when a magnetic field is applied, the output voltage from the switch section 224 comes out in the form of AC at the excitation frequency. Since the function (a) (See FIG. 17 (a)) output has a different impedance than the function (b) (See FIG. 17 (b)) output, amplifier 225 will produce errors unless it has a high input impedance. Therefore, a high input impedance circuit with an operational non-inverting amplifier, is used for amplifier 325. As another example, a FET operational amplifier may be used.

In the circuit of such construction, several-gauss zero gauss-shifts were obtained by using the resistance-unbalance element (by installing 4 electrodes on the material on which Hall effect is caused) which has conventionally been regarded as being unusable, and the temperature characteristics were almost in proportion with the temperature characteristics of the Hall coefficient. Thus, by using a Ge Hall element, it is possible to compensate up to 0.2 gauss in zero point compensation accuracy and up to 0.0016 gauss/°C. in zero point temperature variations accuracy.

As mentioned before, this invention enables the determination of the Hall voltage, making it possible to regulate the zero point compensation accuracy up to 0.5 gauss and the zero point temperature variations accuracy up to 0.0016 gauss/°C., because the control current supplying power source is connected alternately between two terminals of 4-terminal Hall element to obtain Hall voltage and voltages including the Hall voltage between the above-mentioned two terminals by means of utilizing the even effect and non-even effect of magnetic field, whereby arrangement is made so as to detect the potential difference of both voltages.

The fourth embodiment is a residual voltage regulating circuit for a Hall element wherein analog switches are utilized for connecting constant-current regulated power and a high input impedance amplifier between the different two terminals of a 4-terminal Hall element by means of changing-over alternately the above-mentioned two terminals, whereby said analog switches are controlled by an oscillator output.

In order to accomplish the separation of voltages, for example, 4-terminal Hall element 110' is used as shown in FIG. 7 (b), whereby the change-over switches SW1–SW4 are connected between the terminals 120'–150', the control current supplying power source E and the terminals 160a–190b of the voltmeter V for their interlocking motion, and arrangement is made to make it possible to connect the voltmeter selectively between the terminals 150' and 120' and between the terminals 130' and 140' of 4-terminal Hall element 110', with the positive pole to the terminal 120' or 150' and with the negative pole to the terminal 130' or 140'.

Figure 8:
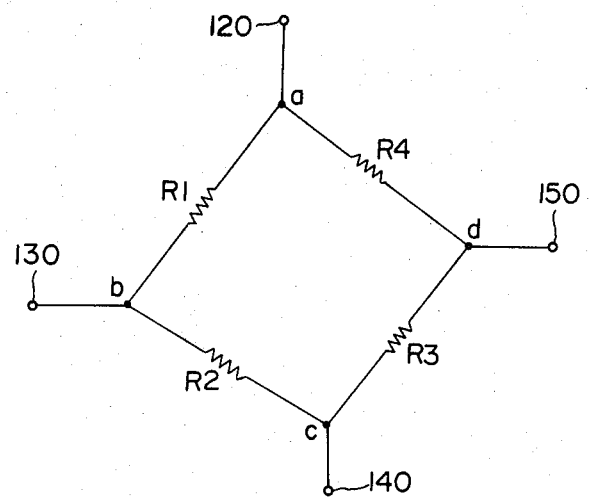

As shown in FIG. 7 (b), in case the control current supplying power source E is connected between the terminals 120' and 140' and the voltmeter V is connected between the terminals 130' and 150' by means of the above-mentioned switches in this circuit, by the equivalent circuit of 4-terminal Hall element 110' shown in FIG. 8, the voltage between the terminals 130' and 140' of FIG. 7(b) is expressed by the equation:

$$VHA_{bc} = \frac{(R3 + R4)(R1 + R2)}{R1 + R2 + R3 + R4} \times \frac{R2}{R1 + R2} \times I \quad (1)$$

$$= \frac{R2(R3 + R4)}{R1 + R2 + R3 + R4} \times I$$

the voltage between the terminals 140' and 150' is expressed by the equation:

$$VHA_{cd} = \frac{(R1 + R2)(R3 + R4)}{R1 + R2 + R3 + R4} \times \frac{R4}{R3 + R4} \times I \quad (2)$$

$$= \frac{R3(R1 + R2)}{R1 + R2 + R3 + R4} \times I$$

Accordingly, from the equations (1) and (2), the voltage between the terminals 130' and 150' is expressed by $$\frac{R4R2 - R3R1}{R1 + R2 + R3 + R4} \times I.$$

Next, control current supply power source E is connected between terminals 130' and 150'. The voltage between terminals 120' and 150' is expressed by the equation:

$$VHB_{ad} = \frac{(R1 + R4)(R2 + R3)}{R1 + R2 + R3 + R4} \times \frac{R4}{R1 + R4} \times I \quad (3)$$

$$= \frac{R4(R2 + R3)}{R1 + R2 + R3 + R4} \times I$$

while, the voltage between the terminals 140' and 150' is expressed by the equation:

$$VHB_{cd} = \frac{(R2 + R3)(R1 + R4)}{R1 + R2 + R3 + R4} \times \frac{R3}{R2 + R3} \times I \quad (4)$$

$$= \frac{R3(R1 + R4)}{R1 + R2 + R3 + R4} \times I$$

Accordingly, from the equation (3) and (4), the voltage between the terminals 120' and 140' is expressed by $$\frac{R4R2 - R3R1}{R1 + R2 + R3 + R4} \times I.$$

In consequence, if inspection is made of the polarity of the voltage between b and d and the voltage between a and c which were obtained by changing over the switches SW1–SW4, the Hall voltage between b and d comes to $-VH$ in the same direction of magnetic field. Therefore, the difference of voltages including Hall voltages between b and d and between a and c comes to 2VH.

In other words, when, as shown in FIG. 14 (a) and FIG. 14 (b), the control current supplying power source E is connected between the terminals 120' and 140' of 4-terminal Hall element 110', and the Hall voltage between terminals 130' and 150' is $VH_{bd} = +VH$ when the current I flows, between a and c of the above-mentioned Hall element as influenced by the magnetic field B, the Hall voltage between terminals 120' and 140' comes to $VH_{ac} = -VH$ if the control current supplying power source E is connected between terminals 130' and 150' and the current I flows between b and c of the Hall elements as influenced by the same magnetic field B.

FIG. 15 shows the preferred embodiment for measuring both of the above-mentioned voltages in a short time, wherein DC power source 160' supplies the control current, oscillator 170' performs the control of taking out only the Hall voltage as the output by making the switches (analog switches) SW1-SW4 work, and potentiometer 180' takes out the output voltage of Hall element 110' in the form of AC or DC on output terminal 190' for the purpose of determining the Hall voltage of Hall element 110.

Figure 17A:
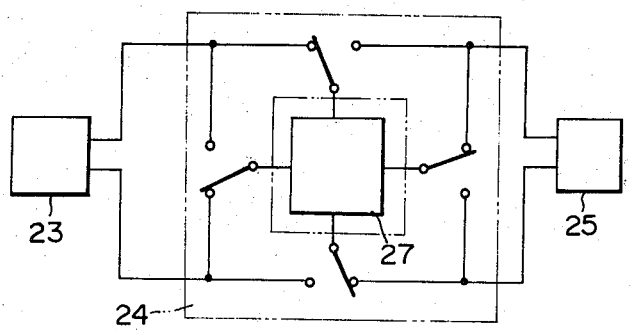
Figure 17B:
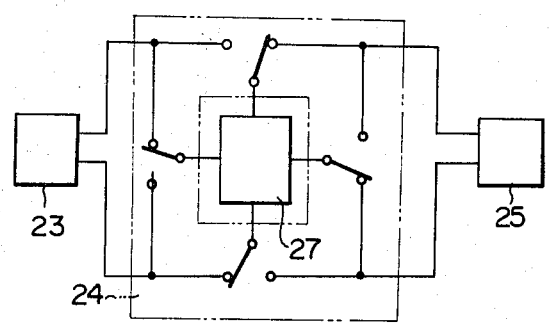

FIG. 16 illustrates a more detailed residual voltage regulating circuit in accordance with the present invention power source section 321, oscillator section 322 composed of free running multivibrator 322a and flip-flop circuit 322b, constant-current regulated power section 323 for Hall element control current composed of reference voltage generator 323a and volt-ampere transducer 323b, switch section 324 composed of four analog switches 324a-324h enabling the removal of the even effect of magnetic field representing the resistance variation by the two functions shown in FIG. 17(a) and FIG. 17(b), and amplifying section 325, while 326 indicates the output circuit.

If no magnetic field is applied to the Hall element 327 (sample) to be regulated which is connected between the constant-current power section 323 and the amplifying section 325 through the analog switches 324a-324h, etc., Hall element 327 is regarded as a pure resistance and, with the functions of the amplifying section 324, the output voltage from the switch section comes to zero. In this case, the current produced by constant-current regulated power section 323 must be the same whether analog switches 324a-324h are arranged to perform function (a) or function (b) (see FIGS. 17(a) and 17(b), respectively). Furthermore, analog switches 324a-324h may be constructed as shown in FIG. 13 in order to avoid errors caused by switching spikes.

When MOS analog switches as shown in FIG. 13 were used as the analog switches, zero movement of less than 3 gauss was measured between the excitation frequencies of 4 kHz and 200 Hz. However, such zero movement can be eliminated by other zero adjusting circuit.

Next, when a magnetic field is applied, the output voltage from switch section 324 comes out in the form of AC at the excitation frequency. Since the function (a) (See FIG. 17(a)) output has a different impedance than the function (b) (See FIG. 17(b)) output, amplifier 325 will produce errors unless it has a high input impedance. Therefore, a high input impedance circuit with an OP Amp., non-inversion amplifier, is used for amplifier 325. As another example, an FET OP amplifier may be used.

In the circuit of such construction, several-gauss zero gauss-shifts were obtained by using the resistance-imbalance element (by installing 4 electrodes on the material on which Hall effect is caused) which has conventionally been regarded as being unusable, and the temperature characteristics were almost in proportion with the temperature characteristics of the Hall coefficient. Thus, by using a Ge Hall element, it is possible to compensate up to 0.2 gauss in zero point compensation accuracy and up to 0.0016 gauss/°C. in zero point temperature variations accuracy.

As mentioned before, this invention enables the determination of the Hall voltage, making it possible to regulate the zero point compensation accuracy up to 0.5 gauss and the zero point temperature variations accuracy up to 0.0016 gauss/°C., because the control current supplying power source is connected alternately between two terminals of a 4-terminal Hall element to obtain Hall voltage and voltages including the Hall voltage between the above-mentioned two terminals by means of utilizing the even effect and non-even effect of magnetic field, whereby arrangement is made so as to detect the potential difference of the both voltages.

I claim:

1. A residual voltage regulating circuit for a Hall element comprising:
   a Hall element having first, second and third terminals;
   a source of constant-current;
   an oscillator;
   switching means, responsive to said oscillator, for interconnecting said Hall element and said source for directing said constant-current through said first and third terminals during a first time period, and through said second and third terminals during a second time period;
   measuring means, connected to said first, second and third terminals and responsive to said switching means, for measuring the voltage across said second and third terminals during said first time period and for measuring the voltage across said first and third terminals during said second time period, said measuring means including a high input impedance amplifier; and
   means, attached to said measuring means, for subtracting the voltage measured during said first time period from the voltage measured during said second time period so that the even effects of a magnetic field applied to said Hall element are cancelled, and said subtracting means produces a signal related only to the Hall voltage of said Hall element.

2. A residual voltage regulating circuit for a Hall element comprising:
   a Hall element having first, second, third and fourth terminals;
   a source of constant-current;
   an oscillator;
   switching means, responsive to said oscillator, for interconnecting said Hall element and said source of constant-current, for directing said constant-current through said first and third terminals during a first time period and through said second and fourth terminals during a second time period;
   measuring means, connected to said terminals and responsive to said switching means, for measuring the voltage across said second and fourth terminals during said first time period, and the voltage between said first and third terminals during said second time period, said measuring means including a high input impedance amplifier; and
   means for subtracting said voltage measured during said first time period from said voltage measured during said second time period so as to eliminate the even effects of a magnetic field applied to said Hall element and produce a voltage related to the Hall voltage of said Hall element.

3. A residual voltage regulating circuit for a Hall element comprising:
   a Hall element having first, second and third terminals;
   a reference voltage generator;
   a volt-ampere transducer responsive to said generator for producing a constant-current;
   switching means interconnecting said Hall element and said volt-ampere transducer for directing said constant-current through said first and third terminals during a first time period, and through said second and third terminals during a second time period;

measuring means connected to said first, second and third terminals for measuring the voltage across said second and third terminals during said first time period and for measuring the voltage across said first and third terminals during said second time period; and means, attached to said measuring means, for subtracting the voltage measured during said first time period from the voltage measured during said second time period so that the even effects of a magnetic field applied to said Hall elemen' are cancelled, and said subtracting means produces a signal related only to the Hall voltage of said Hall element.

4. A residual voltage regulating circuit for a Hall element comprising:
a Hall element having first, second, third and fourth terminals;
a reference voltage generator;
a volt-ampere transducer responsive to said generator for producing a constant-current;
switching means, interconnecting said Hall element and said volt-ampere transducer for directing said constant-current through said first and third terminals during a first time period and through said second and fourth terminals during a second time period;
measuring means, connected to said terminals, for measuring the voltage across said second and fourth terminals during said first time period, and the voltage between said first and third terminals during said second time period; and
means for subtracting said voltage measured during said first time period from said voltage measured during said second time period so as to eliminate the even effects of a magnetic field applied to said Hall element and produce a voltage related to the Hall voltage of said Hall element.

5. A residual voltage regulating circuit for a Hall element comprising:
a Hall element having first, second and third terminals;
a source of constant-current;
switching means interconnecting said Hall element and said source for directing said constant-current through said first and third terminals during a first time period, and through said second and third terminals during a second time period;
measuring means connected to said first, second and third terminals for measuring the voltage across said second and third terminals during said first time period and for measuring the voltage across said first and third terminals during said second time period;
a comparator, attached to said measuring means, having an inverting input, a non-inverting input, and an output, the voltage measured during said first time period being applied to said non-inverting input, and the voltage measured during said second time period being applied to said inverting input, the output of said comparator being related to the difference of said voltage measurements; and
voltage indicating means, said comparator and voltage indicating means subtracting the voltage measured during said first time period from the voltage measured during said second time period so that the even effects of a magnetic field applied to said Hall element are cancelled, and said subtracting means produces a signal related only to the Hall voltage of said Hall element.

6. A residual voltage regulating circuit for a Hall element comprising:
a Hall element having first, second, third and fourth terminals;
a source of constant-current;
switching means, interconnecting said Hall element and said source of constant-current, for directing said constant-current through said first and third terminals during a first time period and through said second and fourth terminals during a second time period;
measuring means, connected to said terminals, for measuring the voltage across said second and fourth terminals during said first time period, and the voltage between said first and third terminals during said second time period;
a comparator, attached to said measuring means, having an inverting input, a non-inverting input, and an output, the voltage measured during said first time period being applied to said non-inverting input, and the voltage measured during said second time period being applied to said inverting input, the output of said comparator being related to the difference of said voltage measurements; and
voltage indicating means, said comparator and voltage indicating means subtracting said voltage measured during said first time period from said voltage measured during said second time period so as to eliminate the even effects of a magnetic field applied to said Hall element and produce a voltage related to the Hall voltage of said Hall element.

7. A residual voltage regulating circuit for a Hall element comprising:
a Hall element having first, second and third terminals;
a reference voltage generator;
a volt-ampere transducer responsive to said generator for producing a constant-current;
an oscillator;
switching means, responsive to said oscillator, for interconnecting said Hall element and said volt-ampere transducer for directing said constant-current through said first and third terminals during a first time period, and through said second and third terminals during a second time period;
measuring means, connected to said first, second and third terminals and responsive to said switching means, for measuring the voltage across said second and third terminals during said first time period and for measuring the voltage across said first and third terminals during said second time period, said measuring means including a high input impedance amplifier;
a comparator, attached to said measuring means, having an inverting input, a non-inverting input, and an output, the voltage measured during said first time period being applied to said non-inverting input, and the voltage measured during said second time period being applied to said inverting input, the output of said comparator being related to the difference of said voltage measurements; and
voltage indicating means, said comparator and voltage indicating means subtracting the voltage measured during said first time period from the voltage measured during said second time period so that the even effects of a magnetic field applied to said Hall element are cancelled, and said subtracting means produces a signal related only to the Hall voltage of said Hall element.

8. A residual voltage regulating circuit for a Hall element comprising:
- a Hall element having first, second, third and fourth terminals;
- a reference voltage generator;
- a volt-ampere transducer responsive to said generator for producing a constant-current;
- an oscillator;
- switching means, responsive to said oscillator, for interconnecting said Hall element and said volt-ampere transducer, for directing said constant-current through said first and third terminals during a first time period and through said second and fourth terminals during a second time period;
- measuring means, connected to said terminals and responsive to said switching means, for measuring the voltage across said second and fourth terminals during said first time period, and the voltage between said first and third terminals during said second time period, said measuring means including a high input impedance amplifier;
- a comparator, attached to said measuring means, having an inverting input, a non-inverting input, and an output, the voltage measured during said first time period being applied to said non-inverting input, and the voltage measured during said second time period being applied to said inverting input, the output of said comparator being related to the difference of said voltage measurements; and
- voltage indicating means, said comparator and voltage indicating means subtracting said voltage measured during said first time period from said voltage measured during said second time period so as to eliminate the even effects of a magnetic field applied to said Hall element and produce a voltage related to the Hall voltage of said Hall element.

9. A circuit as in claim 1, 2, 7 or 8 wherein said oscillator comprises a free-running multivibrator and a flip-flop circuit.

* * * * *